United States Patent
McCullough

(10) Patent No.: US 6,397,941 B1
(45) Date of Patent: Jun. 4, 2002

(54) NET-SHAPE MOLDED HEAT EXCHANGER

(75) Inventor: Kevin A. McCullough, Warwick, RI (US)

(73) Assignee: Cool Options, Inc., Warwick, RI (US)

( * ) Notice: Subject to any disclaimer, the term of this patent is extended or adjusted under 35 U.S.C. 154(b) by 0 days.

(21) Appl. No.: 09/707,778

(22) Filed: Nov. 7, 2000

Related U.S. Application Data

(60) Provisional application No. 60/168,274, filed on Dec. 1, 1999.

(51) Int. Cl.[7] .................................................. F28F 7/00
(52) U.S. Cl. ................ 165/185; 165/80.3; 165/104.33; 361/697; 361/700; 257/715; 257/722
(58) Field of Search ............................... 165/80.3, 185, 165/104.33; 361/697, 700, 701, 702, 703, 709, 710; 257/715, 706, 722; 174/16.3, 15.2

(56) References Cited

U.S. PATENT DOCUMENTS

| | | | | |
|---|---|---|---|---|
| 2,719,354 A | * | 10/1955 | Dalin | .......................... 165/185 |
| 4,356,864 A | * | 11/1982 | Ariga et al. | .................. 165/185 |
| 5,329,993 A | * | 7/1994 | Ettehadieh | ................... 165/80.4 |
| 5,331,510 A | * | 7/1994 | Ouchi et al. | .................. 361/702 |
| 5,409,055 A | * | 4/1995 | Tamaka et al. | ......... 165/104.33 |
| 6,052,012 A | * | 5/2000 | Cooper et al. | ............... 361/704 |
| 6,102,110 A | * | 8/2000 | Julien et al. | ............ 165/104.33 |
| 6,105,662 A | * | 8/2000 | Suzuki | ................... 165/104.33 |

* cited by examiner

*Primary Examiner*—Henry Bennett
*Assistant Examiner*—Terrell McKinnon
(74) *Attorney, Agent, or Firm*—Barlow, Josephs & Holmes, Ltd.

(57) ABSTRACT

A net-shape molded heat exchanger is provided which includes a thermally conductive main body and a number of thermally conductive arms connected to and extending from the main body. A number of thermally conductive fins are connected to the arms. The heat exchanger is formed by net-shape molding a main body, the arms which emanate from the main body and the fins from a thermally conductive composition, such as a polymer composition. The molded heat exchanger is freely convecting through the part which makes it more efficient and has an optimal thermal configuration. Optionally, heat pipes may be embedded within the arms of the heat exchanger to further enhance heat dissipation.

4 Claims, 4 Drawing Sheets

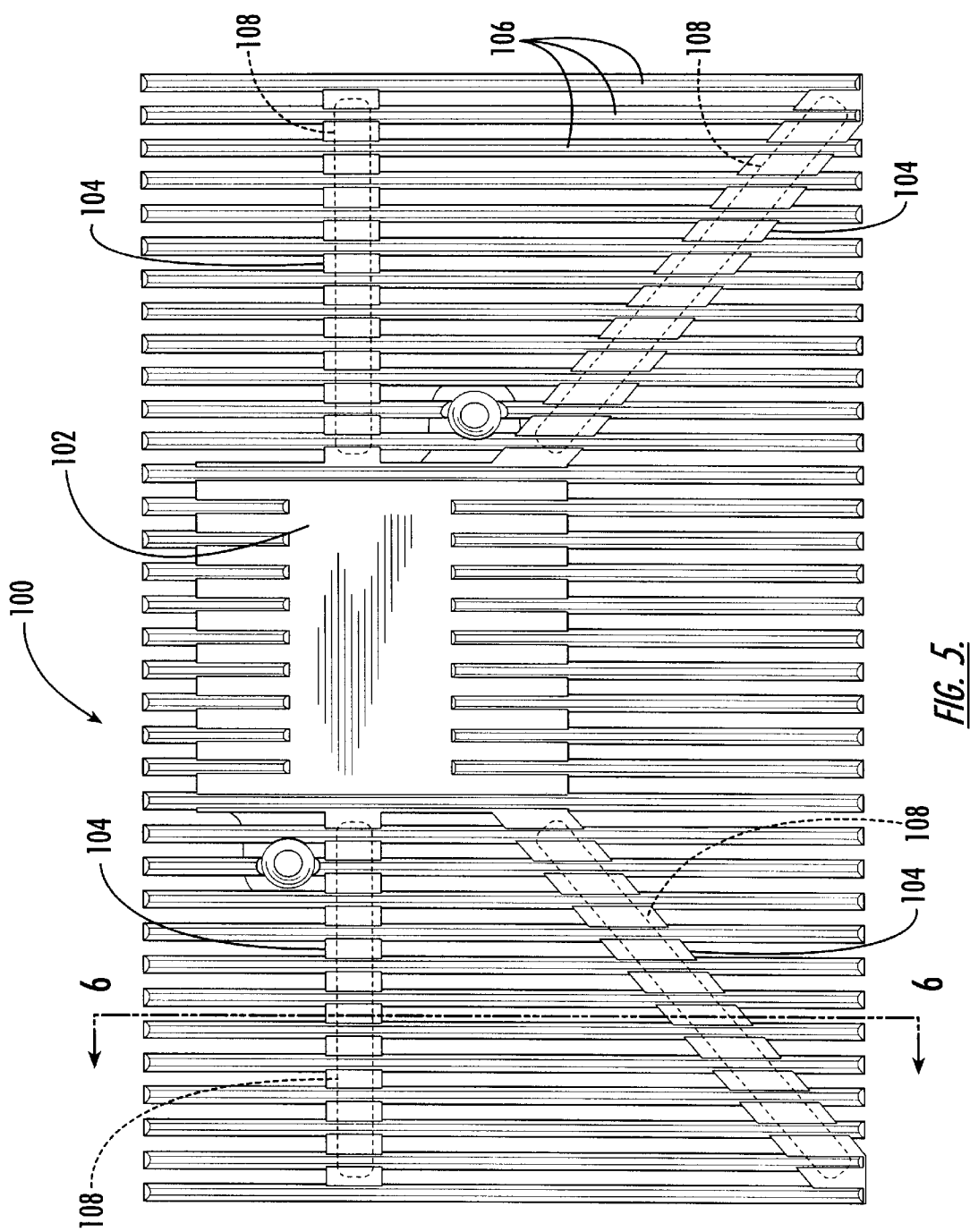
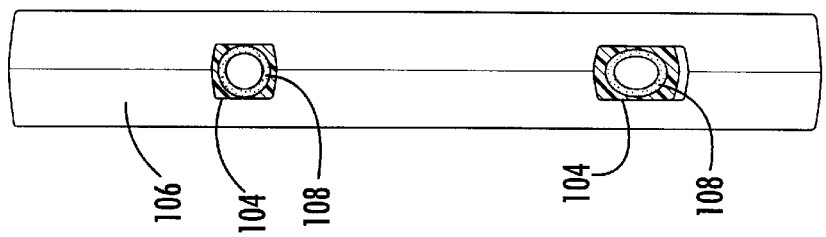

NET-SHAPE MOLDED HEAT EXCHANGER

This application claims the benefit of provisional application No. 60/168,274, filed Dec. 1, 1999.

BACKGROUND OF THE INVENTION

The present invention relates generally to the cooling of heat generating surfaces and objects. More specifically, the present invention relates to apparatuses for dissipating heat generated by such objects. In addition, the present invention relates to cooling of heat generating objects by use of composite materials and devices without the use of external fans to assist in cooling.

In industry, there are various parts and components that generate heat during operation. For example, in the electronics and computer industries, it is well known that computer components generate heat during operation. Various types of electronic device packages and integrated circuit chips, such as the PENTIUM central processing unit chip (CPU) manufactured by Intel Corporation and RAM (random access memory) chips are such devices that generate heat. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

There are a number of prior art methods to cool heat generating components and objects to avoid device failure and overheating, as discussed above. A block heat sink or heat spreader is commonly placed into communication with the heat generating surface of the object to dissipate the heat therefrom. Such a heat sink typically includes a base member with a number of individual cooling members, such as fins, posts or pins, to assist in the dissipation of heat. The geometry of the cooling members is designed to improve the surface area of the heat sink with the ambient air for optimal heat dissipation. The use of such fins, posts of pins in an optimal geometrical configuration greatly enhances heat dissipation compared to devices with no such additional cooling members, such as a flat heat spreader.

To further enhance air flow and resultant heat dissipation, fans and devices have been used, either internally or externally. However, these external devices consume power and have numerous moving parts. As a result, heat sink assemblies with active devices are subject to failure and are much less reliable than a device which is solely passive in nature.

It has been discovered that more efficient cooling of electronics can be obtained through the use of passive devices which require no external power source and contain no moving parts. It is very common in the electronics industry to have many electronic devices on a single circuit board, such as a motherboard, modem, or "processor card" such as the Celeron board manufactured by Intel Corporation. For example, video cards, which are capable of processing millions of polygons per second, are also susceptible to overheating and need efficient and effective cooling as do the CPUs discussed above. Video cards typically have at least one chip thereon that runs extremely hot to necessitate a video card cooling system.

There have been prior art attempts to provide effective and efficient cooling to video cards, and the like. The devices of the prior art are simply the technology previously used for CPUs and modified to connect to a video card. In particular, machined block heat sinks of metal have been typically used for cooling CPU chip, such as the Pentium processor, as described above. These block heat sinks have been modified in size to match the size of the chip on the video card to be cooled. Since the prior art heat sink is made of metal, it must be machined to achieve the desired fin configuration. Since the machining process is limited, the geometry of the fin configuration of a machined heat sink is inherently limited.

In the heat sink industries, it has been well known to employ metallic materials for thermal conductivity applications, such as heat dissipation for cooling semiconductor device packages. For these applications, such as heat sinks, the metallic material typically is tooled or machined from bulk metals into the desired configuration. However, such metallic conductive articles are typically very heavy, costly to machine and are susceptible to corrosion. Further, the geometries of machined metallic heat dissipating articles are very limited to the inherent limitations associated with the machining or tooling process. As a result, the requirement of use of metallic materials which are machined into the desired form, place severe limitations on heat sink design particular when it is known that certain geometries, simply by virtue of their design, would realize better efficiency but are not attainable due to the limitations in machining metallic articles.

It is widely known in the prior art that improving the overall geometry of a heat dissipating article, can greatly enhance the overall performance of the article even if the material is the same. Therefore, the need for improved heat sink geometries necessitated an alternative to the machining of bulk metallic materials. To meet this need, attempts have been made in the prior art to provide molded compositions that include conductive filler material therein to provide the necessary thermal conductivity. The ability to mold a conductive composite enabled the design of more complex part geometries to realize improved performance of the part.

As a result, optimal geometries cannot be achieved with a machined metal heat sink. To compensate for these limitations, active cooling, such as by powered fans, must be employed to achieve the requisite cooling to prevent device failure.

In addition, processor cards or daughter cards, such as video cards, are typically designed, due to their edge connect configuration, to fit into tight and narrow spaces. However, these video cards have now required heat dissipation for which there is very little or no space.

In view of the foregoing, there is a demand for a heat sink assembly that is capable of dissipating heat. There is a demand for a passive heat sink assembly with no moving parts that can provide heat dissipation without the use of active components. In addition, there is a demand for a complete heat sink assembly that can provide greatly enhanced heat dissipation over prior art passive devices with improved heat sink geometry. There is a demand for a heat sink assembly that can provide heat dissipation in a low profile configuration. There is a further demand for a net-shape molded heat sink assembly that is well suited for cooling daughter computer cards, such as video cards.

SUMMARY OF THE INVENTION

The present invention preserves the advantages of prior art heat dissipation devices, heat exchangers and heat spreaders. In addition, it provides new advantages not found in currently available devices and overcomes many disadvantages of such currently available devices.

The invention is generally directed to the novel and unique molded heat exchanger that is net-shape molded of a thermally conductive polymer composition. The present invention relates to a molded heat exchanger for dissipating heat from a heat generating source, such as a computer semiconductor chip or electronic components on a computer circuit board, such as a video card.

The molded heat exchanger of the present invention has many advantages over prior art heat sinks in that it is injection molded from the thermally conductive polymer materials which enables the part to be made in complex geometries. These complex geometries enable the heat sink fin configuration to be optimized to be more efficient thus dissipating more heat. As a result, the molded heat exchanger is freely convecting through the part which makes it more efficient. The ability to injection mold the heat exchanger permits the optimal configuration to be realized and achieved. Arms are provided which extend to the various corners of the exchanger. These arms do not have to be parallel as in prior art cast or machined aluminum heat sinks. With the present molded he exchanger, the heat sink can be designed to what is thermally best while not being limited to the manufacturing and mechanical limitations with prior art processes, such as brazing.

Further, since the molded heat exchanger is injection molded, there is tremendous flexibility in the arrangement of the all arms, fins and base of the molded heat exchanger. These various components may be easily optimized to suit the application at hand. For example, the fins may have a "S" configuration as opposed to a planar configuration.

As will be discussed in detail below, arms are provided which extend to the ends and corners of the device. This can be modified as desired. Heat pipes may be provided and embedded within each of the arms which emanate from the base of the heat exchanger. In essence, the thermally conductive polymer material, which makes up the molded heat exchanger, can be easily overmolded over heat pipes to further enhance the thermal conductivity of the overall device.

It is therefore an object of the present invention to provide a heat dissipating device that can provide enhanced heat dissipation for a heat generating component or object.

It is an object of the present invention to provide a heat dissipating device that can provide heat dissipation for semiconductor devices on a circuit board, such as a motherboard or video card.

It is a further object of the present invention to provide a heat dissipating device that has no moving parts.

Another object of the present invention is to provide a heat dissipating device that is completely passive and does not consume power.

A further object of the present invention is to provide a heat dissipation device that inexpensive to manufacture.

Another object of the present invention is to provide a heat dissipation device that has a thermal conductivity greater that conventional heat sink designs.

A object of the present invention is to provide a heat exchanger that is net-shape moldable and has an optimal fin configuration.

Yet another objection of the present invention is to provide a molded exchanger that has a low profile configuration without sacrificing thermal transfer efficiency.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

FIG. 5 is a top view of an alternative embodiment of the molded heat exchanger of the present invention; and FIG. 6 is a cross-sectional view through the line 6—6 of FIG. 5.

DETAILED DESCRIPTION OF THE PREFERRED EMBODIMENT

Figure 1:
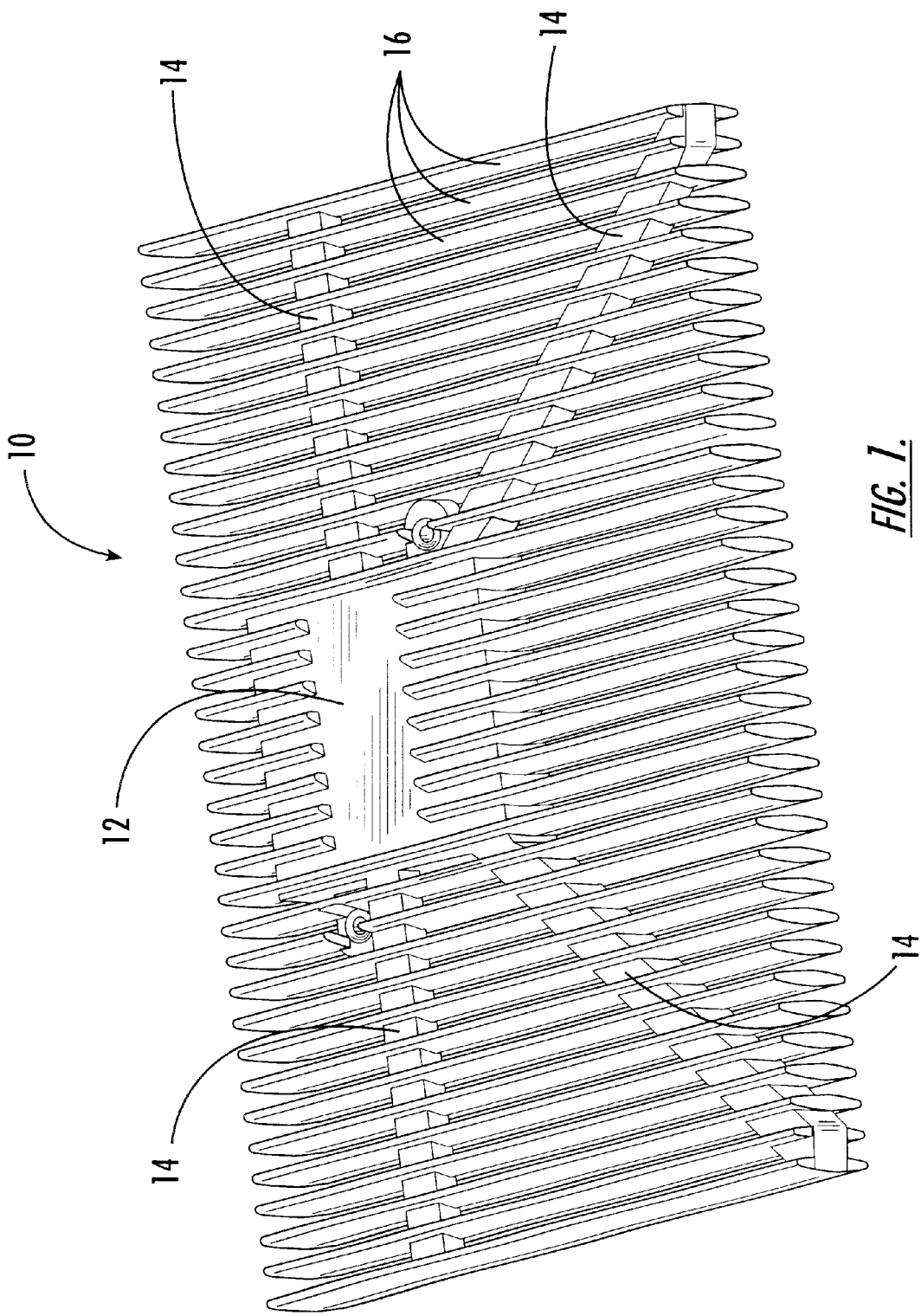
FIG. 1 is a perspective view of the preferred embodiment of the molded heat exchanger of the present invention.
Figure 2:
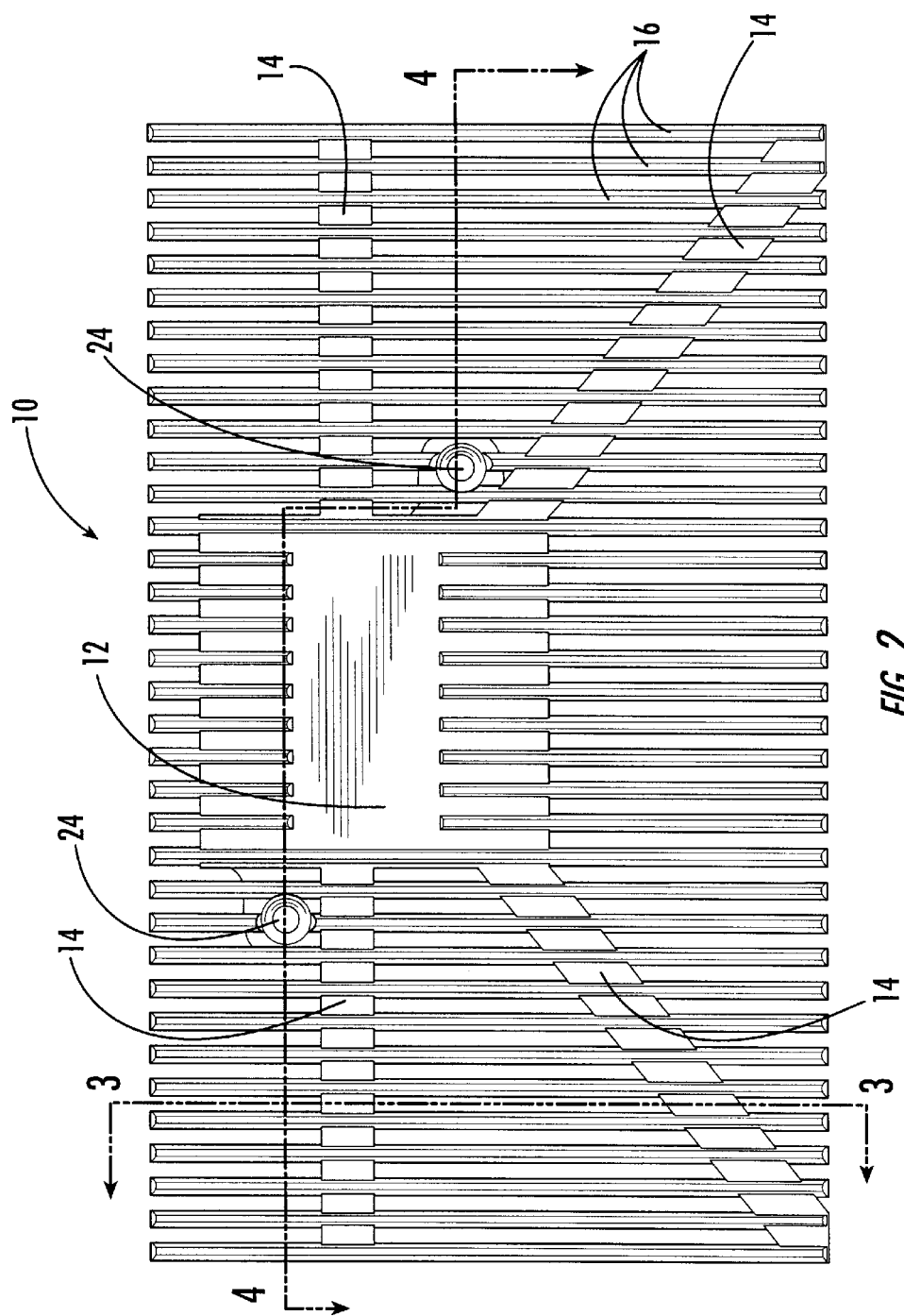
FIG. 2 is a top view of the molded heat exchanger shown in FIG. 1.
Figure 3:
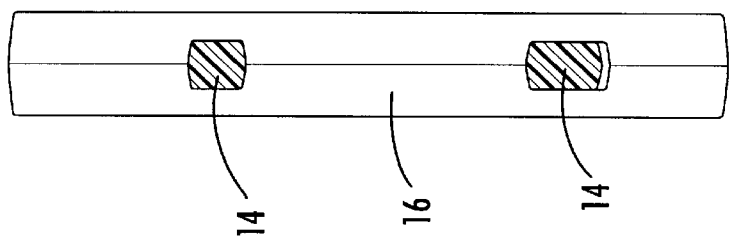
FIG. 3 is a cross-sectional view through the line 3—3 of FIG. 2.

Referring first to FIGS. 1–3, the net-shape molded heat exchanger 10 of the present invention is shown. In FIG. 1, a perspective view of the molded heat exchanger 10 of the present invention is shown while FIG. 2 illustrates a top view and FIG. 3 shows a cross-sectional view through the line 3—3 of FIG. 2. The molded heat exchanger 10 includes a main body section 12 with a number of outward extending arms 14. Transverse fin members 16 are also provided. The molded heat exchanger 10 is net-shape molded, such as by injection molding, into a unitary structure from thermally conductive material, such as a thermally conductive polymer composition. The thermally conductive polymer composition includes a base polymer of, for example, a liquid crystal polymer that is loaded with a conductive filler material, such as copper flakes or carbon fiber. Other base materials and conductive fillers may be used and still be within the scope of the present invention. Also, the heat exchanger 10 of the present invention is net-shape molded which means that after molding it is ready for use and does not require additional machining or tooling to achieve the desire configuration of the part.

A described above, the ability to injection mold a thermally conductive device rather than machine it has many advantages. As can be seen in FIGS. 1–3, an intricate arm 14 and fin 16 arrangement, that has optimal heat transfer geometry and properties, can be easily formed as desired. The figures illustrate one of many embodiments of the invention where a thermally conductive composition is net-shape molded into a thermally conductive heat exchanger construction.

In the preferred embodiment, as shown in FIGS. 1–3, the heat exchanger 10 includes a rectangular array of plate-like fins 16 that intersect the main body portion 12 and four arms 14 that extend to each of the four corners of the rectangular array of the fins 14. While still within the scope of the present invention, main body portion 12 and arms 14 may be located in different positions to suit the thermal transfer application at hand.

Figure 4:
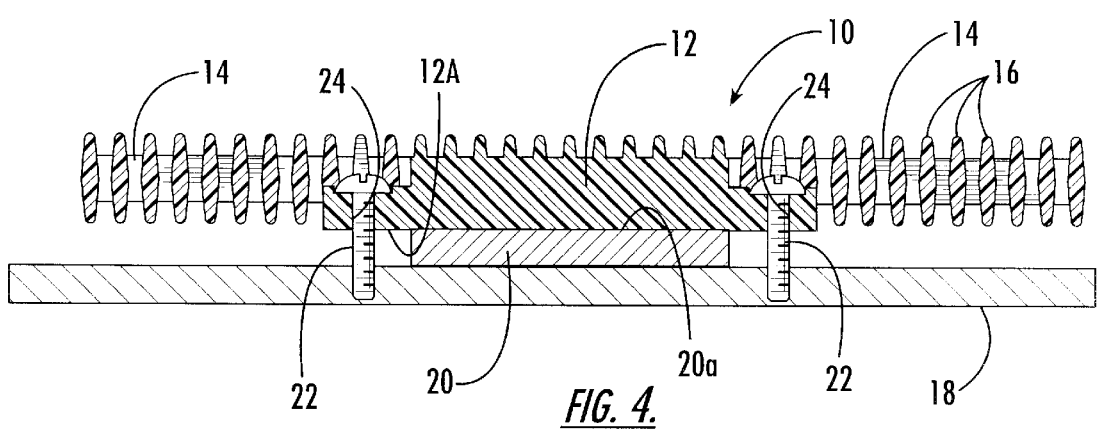
FIG. 4 is a cross-sectional view through the line 4—4 of FIG. 2.

As shown in FIG. 4, the installation of the heat exchanger 10 of the present invention onto a video card 18 is shown, by way of example. The video card 18 includes a semiconductor device 20 that runs hot and is need of heat dissipation to avoid failure. The main body portion 12 is located in a position to thermally interface with the semiconductor device 20 so that the lower flat surface 12a of the main body portion 12 is in flush thermal communication with the top surface 20a of the semiconductor device 20. Fasteners 22, such as threaded screws, are provided to secure the heat exchanger 10, via apertures 24, in thermal transfer relationship. Other different types of fasteners and connection methods may be employed for this purpose, such as spring clips.

It should be understood that the application shown in FIG. 4 is merely an example of the many different applications of the present invention and is for illustration purposes only. The main body portion 12 is shown to be positioned directly over the semiconductor device 20 to be cooled; however, multiple semiconductor devices 20 of different sizes, configurations and layout may be cooled by a modified embodiment in accordance with the present invention.

Referring now to FIGS. 5 and 6, a heat exchanger 100 in accordance with an alternative embodiment of the present invention is shown. FIG. 5 shows a top view of the alternative embodiment of the inventive heat exchanger 100 that includes a main body portion 102 with a number of arms 104 emanating therefrom. Fins 106 are provided in communication with the main body portion 102 and the arms 104. As shown in FIGS. 5 and 6, heat pipes 108 are embedded, preferably, in each of the arms 104 to further enhance thermal transfer from the main body portion 102 to the arms 104 and out through the fins 106. The heat pipes 108 are typically enclosed metal tubes, such as aluminum or copper, with a volume of transfer media, such as water or ammonia, therein. The construction and operation of heat pipes are so well known in the art that they need not be discussed herein. It should be understood that a heat pipe 108 may be omitted from one or more of the arms 104 to suit the heat transfer application at hand.

In accordance with the present invention, a net-shape molded heat exchanger is disclosed that is easy and inexpensive to manufacture and provides thermal transfer that is superior to prior art metal machined heat exchangers by optimization of the geometry of the device.

It would be appreciated by those skilled in the art that various changes and modifications can be made to the illustrated embodiments without departing from the spirit of the present invention. All such modifications and changes are intended to be covered by the appended claims.

What is claimed is:

1. A net-shape molded heat exchanger, comprising:

a thermally conductive main body;

a plurality of thermally conductive arms connected to and extending from said main body in different directions from one another; and a plurality of thermally conductive fins connected to said plurality of arms where each of said thermally conductive fins connect at least two of said arms together; said plurality of thermally conductive fins, said thermally conductive main body and said plurality of thermally conductive arms being integrally molded with one another of a thermally conductive polymer composition.

2. The heat exchanger of claim 1, further comprising:

a heat pipe embedded in at least one of said plurality of thermally conductive arms.

3. A method of net-shape molding a heat exchanger, comprising the steps of:

providing a plurality of heat pipes;

net-shape molding a main body of thermally conductive polymer material, integrally molding a plurality of arms thermally conductive polymer material emanating from said main body in different directions from one another; and integrally molding with the main body and the plurality of arms a plurality of fins of thermally conductive material connected to at least two of the plurality of arms.

4. The method of claim 3, further comprising the step of:

embedding a heat pipe in at least one of the plurality of arms.

* * * * *